United States Patent [19]
Imai et al.

[11] Patent Number: 5,378,506
[45] Date of Patent: Jan. 3, 1995

[54] EVAPORATION METHOD OF FORMING TRANSPARENT BARRIER FILM

[75] Inventors: Nobuhiko Imai, Sugito; Mamoru Sekiguchi, Higashikawaguchi; Mitsuru Kano, Kagurazaka, all of Japan; Thomas Krug, Rodenbach, Germany; Gerhard Steiniger, Ronneburg, Germany; Andreas Meier, Pfullingen, Germany

[73] Assignees: Toppan Printing Co., Ltd., Tokyo, Japan; Leybold Aktiengesellschaft, Hanau, Germany

[21] Appl. No.: 58,132

[22] Filed: May 10, 1993

[30] Foreign Application Priority Data

May 11, 1992 [JP] Japan ............... 4-117717

[51] Int. Cl.⁶ .............................. C23C 16/00
[52] U.S. Cl. .................... 427/529; 427/248.1; 427/294; 427/585
[58] Field of Search ............ 427/569, 585, 248.1, 427/529, 294

[56] References Cited

U.S. PATENT DOCUMENTS

3,442,686  5/1969  Jones ..................... 117/70

FOREIGN PATENT DOCUMENTS

0140221  5/1985  European Pat. Off. .
60-50164  3/1985  Japan .
WO82/02190  7/1982  WIPO .

*Primary Examiner*—Bernard Pianalto
*Attorney, Agent, or Firm*—Burns, Doane, Swecker & Mathis

[57] ABSTRACT

This invention relates to a source material for vapor deposition, which is useful for forming a magnesium oxide thin film by vacuum vapor deposition process, and to a method of forming a transparent barrier film by using the magnesium oxide source material. The source material is composed of a magnesium oxide having a bulk density of 2.5 g/ml or more. This magnesium oxide can be obtained by sintering or fusing magnesium oxide material. For producing a transparent barrier film having a gas barrier property, this magnesium oxide is vapor-deposited on a surface of a transparent plastic base film by means of vacuum vapor deposition. The volume shrinkage or cracking of the evaporation source material can be avoided, thereby stabilizing the evaporation and prolonging duration of the evaporation. Further, it is possible to utilize a high power of electron beam. Since the evaporation source material is substantially free from pore, the evacuation of gas from the evaporation apparatus can be finished within a short period of time, and the vacuum degree within the evaporation apparatus can be stabilized. Since there is no splash or scattering during the evaporation., a transparent barrier film which is uniform in thickness and free from pinhole can be obtained.

8 Claims, 1 Drawing Sheet

EVAPORATION METHOD OF FORMING TRANSPARENT BARRIER FILM

BACKGROUND OF THE INVENTION

The present invention relates to an evaporation source material for vapor deposition which can be used for forming a magnesium oxide thin film through a vapor deposition process, in particular, an electron beam (EB) vapor deposition process, or an ion plating method utilizing the EB vapor deposition, and to a method of forming a transparent barrier film which is excellent in gas-barrier property especially against oxygen gas and moisture.

The vapor deposition technique of magnesium oxide and a thin film obtained from the vapor deposition of magnesium oxide are utilized in various fields such as precision industry, electric industry, package industry, etc.. For example, the magnesium oxide is deposited on a base film to form thereon a transparent barrier film. The barrier film is coated by a sealable film to thereby produce a composite packaging film.

In order to form a magnesium oxide thin film by vacuum vapor deposition process, magnesium metal in combination with oxygen as a reaction gas, magnesium oxide powder or compression-molded product of the magnesium oxide powder is conventionally used as a vapor deposition source material.

However, in the conventional method of using magnesium metal, since magnesium vapor evaporated upon heating reacts with oxygen gas to form a film of magnesium oxide, it is difficult to control composition of the resultant film. Further, since growth rate of the film is dependent upon and limited by the reaction rate between the magnesium vapor and oxygen gas, it is difficult to achieve high speed vapor deposition of magnesium oxide.

Meanwhile, most of the conventional pulverized magnesium oxide material is about 1.5 g/ml or less in bulk density, and 10 μm or less in grain size. Accordingly, it is impossible to densely pack the source material in a crucible or hearth, so that gas tends to be kept within the source material filled in the crucible and the like. Evacuation rate of a chamber is rather slow due to outgas from the source material, thus badly affecting a vacuum degree within the evaporation chamber.

Further, since the packing density of the conventional magnesium oxide source material filled in the crucible and the like is low as mentioned above, and excavation rate of the source material by irradiation of electron bean is too fast, thereby hindering continuous evaporation operation for a long period of time. Moreover, when power of the electron beam is increased, splash or scattering of the source material is caused to occur, thereby rendering the deposition thereof to become unstable. The conventional pulverized source material is rather chemically active, larger in active surface, prone to absorb water and carbon, and vulnerable to denaturing, hence it gives rise to problem of preservation conditions such as short life time. When the source material thus absorbed with water and the like and thus denatured is subjected to the irradiation of electron beam, it will give rise to problems of volume shrinkage and splashing of the source material, thereby causing the vapor deposition to become highly unstable.

In order to avoid these problems, compression-molded product of the powdery source material has been conventionally employed as an evaporation source. This compression-molded product is generally produced by means of hot press. However, the compression-molded product produced in this manner has a bulk density of at most 2.5 g/ml. Some degree of improvements may be achieved with the employment of this compression-molded product. Namely, the bulk density thereof is fairly increased, and the excavation of hole in the source material can be suppressed as compared with the powdery source material. However, the compression-molded product is susceptible to volumetric shrinkage and crack when it is irradiated by electron beam, thereby causing release of gas confined in the compression-molded product, thus instabilizing the degree of vacuum in the evaporation chamber. Further, crushed fragments of the source material vary in size and shape so that exposed surfaces irradiated with electron beam are irregular, thereby instabilizing the evaporation rate. Further, tiny pieces resulting from the crush of the source material may become a cause of splashing. In case of a molded product shaped by using a binder, the volumetric shrinkage and release of outgas are more conspicuous thereby causing deposition of the source material to become more unstable. Further, the production of compression-molded product by using powder raw material gives rise to various problems such as an increase in manufacturing steps, and adjustment of the shape of the molded product to internal shape of the crucible or hearth, thereby extremely increasing the production cost. When the temperature of molding the raw material is raised in view of increasing the bulk density thereof, reduction reaction of magnesium oxide will be caused to occur. On the other hand, when the pressure of molding the raw material is increased, high pressure resistance or rigidity of a press mold may be required, thereby extremely increasing the manufacturing cost.

When the powdery source material or compression-molded source material as mentioned above is employed, the following various problems are imposed on the production of a transparent barrier film due to the defects as explained above in conjunction with the evaporation source material. Their problems associated to the transparent barrier film include formation of pinhole in the resultant deposited film, nonuniformity in thickness of the magnesium oxide layer due to the unstable evaporation, difficulty of performing a high speed deposition under a high feeding speed of a base film web due to limited evaporation rate under a limited degree of the power of electron beam, and incapability of performing a long term evaporation due to quick excavation of holes in the evaporation source.

SUMMARY OF THE INVENTION

An object of this invention is to provide an evaporation source material for vapor deposition, useful for forming a magnesium oxide thin film, which is substantially free from splash or scattering of the source material, stable in evaporation rate, suitable for maintaining excellent and stable vacuum condition, slow in the excavation rate, and suitable for performing a stable evaporation for a long period of time.

Another object of this invention is to provide a source material for vapor deposition useful for forming a magnesium oxide thin film through vacuum vapor deposition process, which is excellent in evaporation performance so that stable evaporation can be realized even if the power of electron beam is elevated, and which is advantageous in shelf life and durability.

A further object of this invention is to provide an evaporation method of forming a transparent barrier film which is free from pinhole and has a uniform thickness.

According to this invention, a magnesium oxide having a high bulk density is employed as an evaporation source material for achieving the above objects. Accordingly, this invention provides the source material for vapor deposition which can be used for forming a magnesium oxide thin film by vacuum vapor deposition process, which is characterized in that the source material comprises magnesium oxide and has a bulk density of 2.5 g/ml or more. The magnesium oxide source material having such a high bulk density can be obtained by molding and sintering a magnesium compound. According to this invention, there is further provided a method of forming a transparent barrier film which comprises a step of vapor-depositing a source material having a high bulk density on a transparent plastic base film through vacuum vapor deposition process, thereby forming a magnesium oxide thin film.

Since magnesium oxide having a bulk density of 2.5 g/ml or more is employed as an evaporation source material according to the present invention, it is possible to minimize splash or scattering of the source material, to stabilize the evaporation rate, to realize an excellent and stable vacuum condition in an evaporation chamber, to make slow the excavation rate, and to perform a stable evaporation for a long period of time. It is also possible according to this invention to evaporate the source material in a stable condition for a long period of time even if the power of electron beam is elevated. Further, it is possible according to the present invention to obtain a transparent barrier film which is free from pinhole and has a uniform thickness.

BRIEF DESCRIPTION OF DRAWINGS

The FIGURE is a schematic diagram showing an apparatus for producing a transparent barrier film according to the invention.

DETAILED DESCRIPTION OF THE INVENTION

Figure 1:
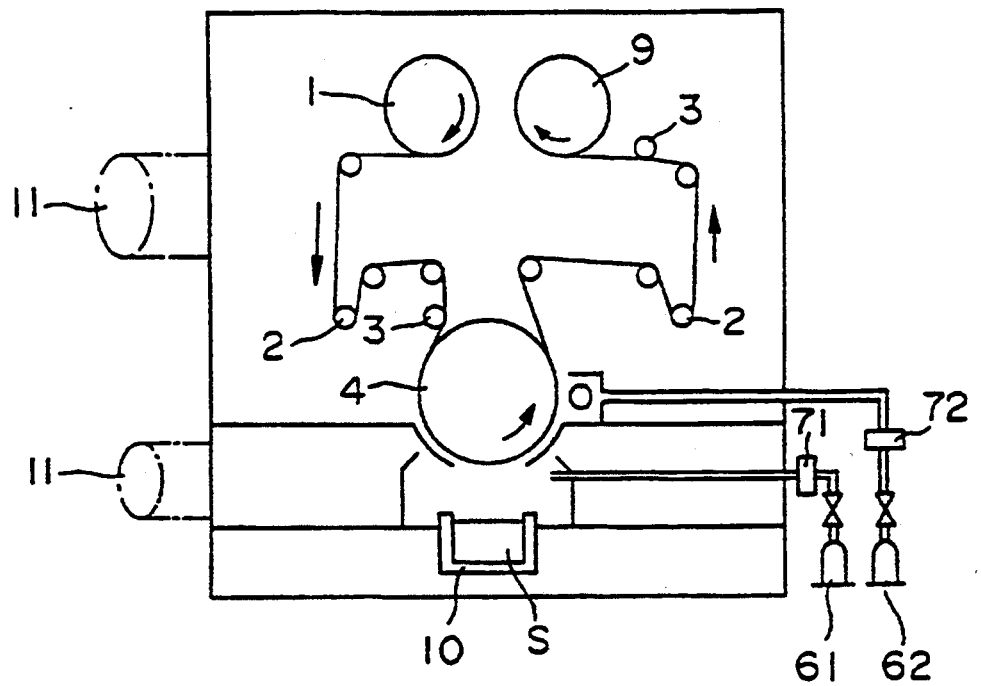

The evaporation source material of this invention can be manufactured by the following various processes.

Process 1

An alkaline material such as NaOH, $Ca(OH)_2$ is added to sea water or brine to obtain precipitation of $Mg(OH)_2$, which is then separated. The $Mg(OH)_2$ thus separated is subjected to refining treatments such as washing with water, dehydration and filteration. This refined $Mg(OH)_2$ is molded into a $Mg(OH)_2$ cake, which is then sintered in a sintering kiln to obtain sintered magnesium oxide. The sintering temperature employed in this process may in general be in the range of 1000°–2500° C., preferably more than 1200° C., and optimumly more than 1600° C., in view of avoiding volumetric reduction, cracking or crushing of evaporation material, which might be caused due to heat applied during the vapor deposition. These volumetric reduction, cracking and the like are more likely to occur as the bulk density of the evaporation source material becomes smaller. In order to avoid this tendency, it is preferable to increase the bulk density of the evaporation source material up to 2.5 g/ml or more, and for that reason it is preferable to perform the sintering treatment at a trmperature of 1600° C. or more in production of the evaporation source material.

The purity of the sintered magnesium oxide thus obtained may be suitably selected depending on the end use of the deposited film. However, as far as the transparent barrier film is concerned, although the presence of impurities may affect the performance of the film, a purity of 60% or more may be generally sufficient for the film to assure a desired property thereof. However, if the content of the impurities in the source material is large, the source material may be softened into a semimelt state in a crucible or hearth due to the heat applied during the vapor deposition process. Further, problems such as volumetric reduction, cracking, crushing and splashing may more likely be caused to occur, thereby instabilizing the composition of evaporated species and the volume of evaporation. Accordingly, in order to stabilize the evaporation of the source material or to stabilize properties of the deposited film such as transparency and the gas barrier properties, it is preferred that the source material should be as pure and uniform in composition as possible. Therefore, it is preferred that the purity of the source material should be 95% or more, and more desirably over 99%. It is preferable, in order to obtain a sintered magnesium oxide of high purity, that the sintering temperature is sufficiently high enough, though the purity of the source material is also dependent upon the refining process prior to the sintering step as well as upon the purity of molded product. Therefore, the sintering temperature should preferably be 1600° C. or more in order to obtain an evaporation source material of high purity.

The bulk density of the sintered magnesium oxide should, as mentioned above, be 2.5 g/ml or more and preferably 3.3 g/ml or more in order to make the source material sufficiently dense. The primary grain size, i.e., the diameter of MgO crystal (diameter of periclase) is closely related to the chemical activity. Namely the larger the size thereof, the more it becomes chemically inactive, because the grain of larger size is higher in crystallinity, thereby diminishing the active surface. To be more specific, MgO crystal of larger grain size is more resistive to water vapor and carbon dioxide gas as compared with that of smaller grain size. The size of the crystal to be formed is mainly dependent on the sintering temperature. Namely, the higher the sintering temperature, the larger the crystal size becomes. When the sintering is performed at a temperature within the range as mentioned above, the crystal of the sintered magnesium oxide is usually grown in several tens micrometer to several hundreds micrometer, which is large enough to make it chemically inactive. Therefore, the sintered magnesium oxide produced in the conditions as mentioned above can generally overcome the problems related to the primary grain size.

The secondary grain size, i.e., pellet size of the sintered source material should be such that the source material charged in a crucible or hearth is flat with respect to a base film on which the source material is deposited. In short, the upper limit of the sintered pellet size should be such that the evaporation vapor volome generated from the surface of the source material is substantially constant irrespective of which portion of the pellet of the source material is irradiated by the electron beam, and that the cloud of vapor emitted from the source material is not blocked by the pellet itself even if the volume of the source material is excavated due to the sublimation thereof. The lower limit of the sintered pellet size should be such that the splash of the source material can be inhibited even if the power of the electron beam is increased. Namely, the pellet size of the source material should be larger than the diameter of the electron beam. Accordingly, the secondery grain size is preferably selected from the range of 0.1–100 mm, more preferably 1–50 mm. When the source material having a pellet size ranging from 0.1 mm to 100 mm is employed, the volumetric reduction, cracking or crushing of the source material can be avoided, thereby allowing very stable sublimation.

Process 2

$Mg(OH)_2$ which can be obtained as an intermediate material in Process 1 mentioned above is lightly sintered at a temperature of 1000° C. or less to produce pulverized magnesium oxide. This powdery magnesium oxide is molded again, and heavily sintered in the same manner as that of Process 1 mentioned above, thereby producing an evaporation source material having dense composition.

Process 3

Not only the pulverized magnesium oxide obtained during the Process 2, but also magnesium oxide obtained through the pyrolysis of magnesium chloride, as well as powdery magnesium oxide obtained by burning and oxidizing metal magnesium may be molded and sintered in the same manner as that of Process 1 mentioned above, thereby forming an evaporation source material of dense composition.

Process 4

Sintered magnesium oxide is obtained by calcinating natural magnesite in this process.

The source material used for vapor deposition according to this invention may also be selected from different structural forms produced by the following processes.

Process I

Beside magnesium oxide, other kinds of magnesium compounds such as magnesium hydroxide and magnesium carbonate, or sintered magnesium oxide as obtained according to Processes 1–4 mentioned above is subjected to arc-melting in an electric furnace and then solidified to obtain a fused magnesia.

Process II

The same raw materials as those of Process I are further calcinated to obtain sintered magnesium oxide in the form of brick or ceramic.

The process of forming a transparent barrier film according to this invention will be explained hereinafter. First, a transparent base film is employed as a substrate for the transparent barrier film. This transparent plastic base film should be in the form of an elongated sheet which can be continuously fed in order to deposit a uniform gas barrier film thereon. This elongated sheet can be supplied in the form of a roll. Examples of such a transparent plastic base film that can be used in this invention are those made of polyolefin such as polyethylene, polypropylene and polybutene, polystyrene, polyester such as polyethylene terephthalate, polybuthylene terephthalate and polyethylene-2, 6=naphthalate, polyamide such as nylon-6, nylon-12 and aromatic polyamide, polycarbonate, polyvinyl chloride, polyvinylidene chloride and polyimide. It is also possible to use a copolymer of monomers selected from above examples, or in combination with a monomer other than that mentioned above. The transparent plastic base film may contain any of the conventional additives such as antieleotrostatic agent, ultraviolent absorber, plasticizer, lubricant and colorant. The transparent plastic base film may preferably be an orientated film in view of mechanical strength, extensibility, thermal property and dimensional stability. However, it is also possible to employ a non-orientated film as the transparent plastic base film. Although there is no limitation as to the thickness of the transparent plastic base film, a film having a thickness ranging from 3 to 400 $\mu$m, preferably 5 to 200 $\mu$m may be generally employed in view of improving the mechanical strength and flexibility of the film. In prior to the deposition of the barrier film consisting of magnesium oxide, the surface of the transparent plastic base film may be subjected to surface treatments such as corona discharge treatment, flame treatment, plasma treatment and glow discharge treatment. Further, the surface of the transparent plastic base film may be covered with an anchor coat layer known in the art, or subjected to an antielectrostatic treatment before or after the deposition of a magnesium oxide thin film.

The method of forming a magnesium oxide thin film can be carried out by using an apparatus shown in FIG. 1. Referring to FIG. 1, the apparatus is entirely placed in a vacuum atmosphere of $10^{-4}$–$10^{-6}$ Torr by means of the pump 11. The elongated transparent plastic film is wound around a feed roller 1. from which the transparent plastic base film can be continuously unwound. The transparent plastic base film unrolled in this manner is then fed via a dancer roller 2 and an expander roller 3 to a cooling roller 4. As the transparent plastic base film runs along the surface of the cooling roller 4, vapor consisting of magnesium oxide is contacted to the surface of the transparent plastic film, and cooled to be condensed thereon to form a thin film of magnesium oxide.

The source materials for forming the magnesium oxide thin film is made of a sintered magnesium oxide having a bulk density of 2.5 g/ml or more, and is placed in an evaporation source vessel 10 disposed directly below the cooling roller 4. The sintered magnesium oxide charged into the evaporation source vessel 10 is heated by an electron beam, and evaporated to become vapor, which moves toward the cooling roller 4. When the vapor reaches to the surface of the transparent plastic film which is being cooled by the cooling roller 4, it is cooled upon being contacted with the transparent plastic film, and condensed on the surface of the transparent plastic film thereby forming a magnesium oxide thin film thereon. The transparent plastic film deposited thereon with the magnesium oxide thin film is recovered by a wind-up roller 9 via another expander roller 3 and dancer roller 2. In the drawing, references 61 and 62 respectively denote gas supply sources for supplying oxygen, inert gas and the like, while references 71 and 72 denote mass flow controller, respectively.

It is possible to perform an asist evaporation with using a reactive gas such as oxygen gas or mixed gas containing oxygen gas. Such an assist by the reactive gas is selectively working before the magnesium oxide turned into gaseous state upon heating reaches to the transparent base film. It is also possible to improve the transparency of the deposited film by adopting ion plating technology, which can be conducted by applying high frequency wave or micro-wave to oxygen gas or a mixed gas containing oxygen gas, thereby forming a plasma state during the course of the vacuum evaporation using the electron beam.

The magnesium oxide thin film thus produced is preferably formed of MgO. However, this magnesium oxide thin film generally may contain Mg, $Mg_2O$, $Mg_2O_2$ or $Mg_2O_3$ in addition to MgO. This magnesium oxide thin film may preferably be formed at a thickness of 50 to 5000 angstroms. If the thickness of the film is less than 50 angstroms, the film can not assure a sufficient degree of gas barrier priperty. On the other hand, if the thickness exceeds 5000 angstroms, the flexibility of the magnesium oxide thin film will be extremely degraded so that when the magnesium oxide thin film is bent, crack will more likely occur in the film so that the barrier property of the film will be degraded or fluctuated.

It is also possible to laminate a sealable film such as a heat sealable resin layer on top of the magnesium oxide thin film deposited on the transparent base film thereby forming a composite packaging film excellent in flexibility, transparency and gas barrier property. As a material for the heat sealable resin layer, polyolefin or polyolefin copolymer such as polyethylene, polypropylene and ethylene-vinyl acetate copolymer can be used. The lamination can be conducted by laminating the heat sealable resin layer on the surface of the magnesium oxide thin film with an adhesive being interposed between the heat sealable resin film and the magnesium oxide thin film, or by extrusion-coating the heat sealable resin, which has been molten in advance in an extruder, onto the surface of the magnesium oxide thin film.

It is well recognized that the employment of magnesium oxide having a bulk density of 2.5 g/ml or more as an evaporation source material is advantageous in the following aspects.

(a) The bonding between the crystal grains of sintered magnesium oxide becomes strong, thereby hardening and compacting the source material itself. As a result, volume shrinkage or cracking of the source material due to a release of outgas upon the irradiation of electron beam can be effectively inhibited. Thus, it is possible to stabilize the evaporation.

(b) Since the volume shrinkage or cracking of the source material can be prevented, possibility of electron beam suddenly irradiating onto a fresh surface of the source material can be avoided thereby remarkably diminishing phenomena such as splashing and scattering of the source material. Thus, it is possible to utilize a high power of electron beam.

(c) Since the source material is compact and dense in texture, the exoavation rate of the source material can be remarkably reduced. Thus, it is possible to carry out the evaporation operation in the long run.

(d) Since there is a reduced possibility of pores being formed within the source material, release of outgas during the step is extremely diminished. Thus, it is possible to shorten the evacuation time of an evaporation chamber.

(e) The amount of residual gas remaining in the evaporation source material is negligible, and the formation of cracking and crushing during the irradiation of electron beam can be avoided. As a consequence, the vacuum degree in the apparatus is stabilized.

(f) Since the diameter of the primary particle (crystalloid) is enlarged to chemically inactivate the source material, any particular consideration as to environment for storing the source material is no more required, and the shelf life time of the source material can be prolonged.

When the sintered magnesium oxide is employed as an evaporation source material and a magnesium oxide thin film is deposited on a transparent plastic substrate, the following advantages are recognized.

(g) Since there is no splash or scattering during the evaporation, a transparent barrier film free from pinhole can be obtained.

(h) Since a stable evaporation is assured, a transparent film having a uniform thickness and a stable gas barrier property can be obtained.

(i) Since a stable evaporation can be assured even if the power of electron beam is fairly elevated, it is possible to feed the web of the substrate at a high speed for depositing the transparent barrier film.

(j) Since the rate of excavation is rather slow, the evaporating time can be remarkably prolonged, and a large amount of the transparent barrier film can be produced in one batch.

The followings are examples and comparative examples. The apparatus employed was that shown in the FIGURE. The magnesium oxides employed are listed below.

| Evaporation source material | | | Purity (%) | Bulk density (g/ml) | Pellet size (cm) |
|---|---|---|---|---|---|
| Ex. 1 | A | Sintered magnesium oxide (according to Process 1) | 99.9 | 2.55 | 0.5–1.5 |
| Ex. 2 | B | Sintered magnesium oxide (according to Process 1) | 99.0 | 2.55 | 0.5–1.5 |
| Ex. 3 | C | Sintered magnesium oxide (according to Process 1) | 99.9 | 3.0 | 0.5–1.5 |
| Ex. 4 | D | Sintered magnesium oxide (according to Process 1) | 99.9 | 3.5 | 0.5–1.5 |
| Ex. 5 | E | Sintered magnesium oxide (according to Process 2) | 99.9 | 3.1 | 0.5–1.5 |
| Ex. 6 | F | Sintered magnesium oxide (according to Process 3) | 99.9 | 2.8 | 0.5–1.5 |
| Ex. 7 | G | Sintered magnesium oxide (according to Process 4) | 99.0 | 3.3 | 0.5–1.5 |
| Ex. 8 | H | Fused magnesium oxide (according to Process I) | 99.0 | 3.5 | 0.5–1.5 |
| Ex. 9 | I | Magnesium oxide brick (according to Process II) | 99.0 | 3.48 | 0.5–1.5 |
| Comp. 1 | J | Magnesium oxide powder (light magnesia) | 99.0 | 0.35 | Fine powder |
| Comp. 2 | K | Magnesium oxide powder (heavy magnesia) | 99.0 | 1.02 | Fine powder |
| Comp. 3 | L | Magnesium oxide mold (press-molded) | 99.9 | 1.78 | Fit in shape to crucible |
| Comp. 4 | M | Magnesium oxide mold (press-molded) | 99.9 | 2.40 | Fit in shape to crucible |

(Note) Magnesium oxide brick mentioned above denotes a sintered product that can be obtained by further sintering a sintered magnesium oxide.

(Note) Magnesium oxide brick mentioned above denotes a sintered product that can be obtained by further sintering a sintered magnesium oxide.

EXAMPLE 1

The sintered magnesium oxide A was employed as a source material S for forming a barrier thin film, and charged into the evaporation vessel 10. Then, a polyethylene terephthalate (PET) film of 12 μm in thickness was loaded on the feed roller 1. Then, the apparatus was entirely evacuated to a vacuum degree of $5 \times 10^{-5}$ Torr. Then, this PET film was passed as shown in FIG. 1 through the dancer roller 2, the expander roller 3, the cooling roller 4 and the other expander roller 3, to be finally rolled up by the wind-up roller 9. Meanwhile, the evaporation source vessel 10 positioned directly below the cooling roller 4 was gradually heated up by increasing the power of an electron beam up to 15 kw. The evaporation rate at this moment was measured by a quartz oscillation monitor, and the feeding velocity of the base film was controlled by referring to the monitored value so as to make the film thickness of magnesium oxide deposited on the PET base film as thick as 1000 angstroms.

Observations were made on any change in the apperrence of the evaporation source material A during the irradiation of electron beam, such as the volume shrinkage, cracking and crushing, as well as evaporation performance such as splash and scattering of the evaporation material A. Evaporation stability was evaluated in terms of stability of evaporation rate and the stability of vacuum degree.

The property of the magnesium oxide deposited film was evaluated as follows.

Transparency: Observation with naked eyes $O_2$ barrier property: Measurements were made 5 times or more sampled along the feeding direction of the base film by using MOCON OXTRAN-10/50A (MODERN CONTROLS CO.) under the conditions of 25° C. 100% RH, and an average value of the sampled measurements was calculated in terms of $O_2$ gas permeability.

Moisture barrier property: Measurements were made 5 times or more sampled along the feeding direction of the base film by using MOCON PERMATRAN-WB (MODERN CONTROLS CO.) under the conditions of 40° C. 90% RH, and an average value of the measurements was calculated in terms of water vapor permeability.

The results of these evaluations on the evaporation stability and physical film properties are shown in Table 1.

EXAMPLES 2, 3, 4, 5, 6, 7, 8 and 9

The various types of sintered magnesium oxide B, C, D, E, F, G, H and I were respectively employed as an evaporation source material, and the same procedures as those of Example 1 were carrid out to form the transparent barrier films. The results of evaluations on the evaporation stability and physical film properties are also shown in Table 1.

COMPARATIVE EXAMPLE 1, 2, 3 and 4

The various types of pulverized and molded magnesium oxide J, K, L and M were respectively employed as an evaporation source material, and the same procedures as those of Example 1 were carried out to form the transparent barrier films. The results of evaluations on the evaporation stability and physical film properties are shown in Table 2.

TABLE I

| | Evaporation Stability | | | | | | | |
|---|---|---|---|---|---|---|---|---|
| | States of Material | | States of Evaporation | | | | Physical Film Properties | |
| | cracking, crushing, volume-shrinkage | splash, scatter | Evaporation Rate Stability | Vacuum degree Stability | Evaporability | Transparency | $O_2$ barrier property (cc/m²/day) | Moistur barrier property (cc/m²/day) |
| Ex. 1 Material A | None | None | 1560A/S Stable | $5 \times 10^{-4}$ Torr or less Stable | Good | Good | 1.3–2.2 | 0.6–0.8 |
| Ex. 2 Material B | None | None | 1200A/S Stable | $6 \times 10^{-4}$ Torr or less Stable | Good | Good | 0.9–1.8 | 0.6–0.8 |
| Ex. 3 Material C | None | None | 1650A/S Stable | $4 \times 10^{-4}$ Torr or less Stable | Good | Good | 1.1–2.0 | 0.9–1.0 |
| Ex. 4 Material D | None | None | 1750A/S Stable | $5 \times 10^{-4}$ Torr or less Stable | Good | Good | 1.3–2.2 | 0.6–0.8 |
| Ex. 5 Material E | None | None | 1600A/S Stable | $6 \times 10^{-4}$ Torr or less Stable | Good | Good | 0.9–1.8 | 0.6–0.8 |
| Ex. 6 Material F | None | None | 1400A/S Stable | $4 \times 10^{-4}$ Torr or less Stable | Good | Good | 1.1–2.0 | 0.9–1.0 |
| Ex. 7 Material G | None | None | 1500A/S Stable | $5 \times 10^{-4}$ Torr or less Stable | Good | Good | 1.3–2.2 | 0.6–0.8 |
| Ex. 8 Material H | None | None | 1700A/S Stable | $6 \times 10^{-4}$ Torr or less Stable | Good | Good | 0.9–1.8 | 0.6–0.8 |
| Ex. 9 Material I | None | None | 1550A/S Stable | $4 \times 10^{-4}$ Torr or less Stable | Good | Good | 1.1–2.0 | 0.9–1.0 |

TABLE 2

| Comparative Example | Evaporation Stability | | | | Evaporability | Physical Film Properties | | |
|---|---|---|---|---|---|---|---|---|
| | States of Material cracking, crushing, volume-shrinkage | splash, scatter | States of Evaporation | | | Transparency | $O_2$ barrier property (cc/m²/day) | Moistur barrier property (cc/m²/day) |
| | | | Evaporation Rate Stability | Vacuum degree Stability | | | | |
| Comp. Ex. 1 Material J | Shrinked | Violent scatter | No evaporation due to spattering | $1 \times 10^{-3}$ Torr or more Unstable | Bad *1 | Failing to form a film | | |
| Comp. Ex. 2 Material K | None | Splash and scatter | No evaporation at high power of EB | $1 \times 10^{-3}$ Torr or more Unstable | Bad *2 | Failing to form a film | | |
| Comp. Ex. 3 Material L | Cracked and crushed | Splash and scatter | Fluctuated 500–1500 A/S | $1 \times 10^{-3}$ Torr or more Unstable | Bad | Good | 1–20 | 1–10 |
| Comp. Ex. 4 Material M | Cracked and crushed | Splash | Fluctuated 500–1500 A/S | $1 \times 10^{-3}$ Torr or more Unstable | Bad | Good | 1–30 | 1–9 |

*1 Upon irradiation of electron beam, the source material in the crucible was immediately shrinked and the scattering of the source material was observed. In other words, the source material was not evaporated, and the vacuum degree was deteriorated.

*2 Stabilized evaporation was attained as far as the power of electron beam was kept lower than that of the source material J (Comparative Example 1). However, as the power was increased, the evaporation became unstable.

According to the present invention, it is possible to improve the evaporation stability so that the power of the electron beam can be raised, and a stable high evaporation rate can be attained. Therefore, it is possible to perform a stable and high speed evaporation without spoiling the transparency and gas barrier property of the film. Further, it is possible according to the present invention to minimize the excavation rate so that the evaporation can be continued for a long period of time, thereby greatly increasing the yield of deposited film per batch. It is also possible to control the release of outgas or residual gas, thereby accelerating the evacuation speed and improving evacuation efficiency of the evaporation chamber. Additionally, since the source material is of pellet shape, it is easy to handle thereby improving case of operation. Further, since the source material is chemically stable, the storage life can be greatly prolonged without specifically selecting the storage environments. In view of above, it is possible to improve the productivity of a magnesium oxide thin film as well as of a transparent barrier film, and to minimize the cost of forming the transparent barrier film.

What is claimed is:

1. A method of forming a transparent barrier film, comprising the steps of feeding a transparent base film in a vacuum chamber, and heating an evaporation source material composed of magnesium oxide having a bulk density of 2.5 g/ml or more to evaporate the same to thereby deposit a transparent barrier film composed of magnesium oxide on the transparent base film.

2. A method of forming a transparent barrier film according to claim 1, wherein the evaporation source material is composed of sintered magnesium oxide.

3. A method of forming a transparent barrier film according to claim 1, wherein the evaporation source material is heated by irradiation of an electron beam.

4. A method of forming a transparent barrier film according to claim 1, wherein the transparent barrier film is deposited with the aid of ion plating.

5. A method of forming a transparent barrier film, comprising the steps of feeding a transparent base film in a vacuum chamber, and heating an evaporation source material, without cracking or crushing the source material, composed of magnesium oxide having a bulk density of 2.5 g/ml or more to evaporate the same to thereby deposit a transparent barrier film free from pinhole and composed of magnesium oxide on the transparent base film.

6. The method of claim 5, wherein said transparent barrier film is provided with a uniform thickness.

7. The method of claim 5, wherein during said evaporation no splash occurs.

8. The method of claim 5, wherein during said evaporation no scattering occurs.

* * * * *